United States Patent [19]

Sato et al.

[11] Patent Number: 4,951,259
[45] Date of Patent: Aug. 21, 1990

[54] SEMICONDUCTOR MEMORY DEVICE WITH FIRST AND SECOND WORD LINE DRIVERS

[75] Inventors: Yoichi Sato, Iruma; Satoshi Shinagawa, Ohme, both of Japan

[73] Assignees: Hitachi, Ltd.; Hitachi VLSI Engineering Corp., both of Tokyo, Japan

[21] Appl. No.: 156,742

[22] Filed: Feb. 18, 1988

[30] Foreign Application Priority Data

Feb. 18, 1987 [JP] Japan .................................. 62-33201

[51] Int. Cl.$^5$ .......................... G11C 7/00; G11C 8/00
[52] U.S. Cl. .......................... 365/230.06; 365/189.03; 365/204
[58] Field of Search ............... 365/189, 206, 230, 204, 365/230.06, 189.03; 307/463

[56] References Cited

U.S. PATENT DOCUMENTS

| | | | |
|---|---|---|---|
| 4,620,299 | 10/1986 | Remington | 365/230 |
| 4,685,088 | 8/1987 | Iannucci | 365/230 |
| 4,706,222 | 11/1987 | Kwiatkowski et al. | 365/230 |
| 4,719,603 | 1/1988 | Shinagawa | 365/230 |
| 4,763,304 | 8/1988 | Uesugi | 365/230 X |

Primary Examiner—Stuart N. Hecker
Assistant Examiner—Alyssa H. Bowler
Attorney, Agent, or Firm—Antonelli, Terry, Stout & Kraus

[57] ABSTRACT

A semiconductor memory device is provided which includes a plurality of word line drivers and logic decoding circuitry coupled to the inputs of the word line drivers. In large memory arrays, the word line driver circuits can place large capacitive loads on the output of the logic decoding circuit because the word line driver transistors must be relatively large. This large load on the logic decoding circuitry adversely effects the operating speed of the memory. Accordingly, to reduce this load, a switching arrangement is provided between the output of the logic decoding circuitry and the word line drivers. This switching arrangement can be controlled to respectively connect the output of the logic decoding circuit to the word line drivers based on control output signals of a pre-decoder. Reset MOSFETs can also be provided to prevent the inputs of the word line drivers from floating.

19 Claims, 4 Drawing Sheets

SEMICONDUCTOR MEMORY DEVICE WITH FIRST AND SECOND WORD LINE DRIVERS

BACKGROUND OF THE INVENTION

This invention relates to semiconductor memory devices and to a technique which will be effective when applied, for example, to CMOS (Complementary MOS) static RAMs (Random Access Memories).

CMOS static RAMs including clocked static decoders are known in the art. A method of improving chip layout efficiency has been proposed by disposing a pre-decoder PDCR shown in FIG. 5 in an X address decoder XDRC of such a CMOS static RAM.

Japanese Pat. Laid-Open No. 74890/1981, for example, describes the address decoder of such a static RAM. This publication is hereby incorporated by reference.

In FIG. 5, the X address decoder XDCR of the CMOS static RAM includes one pre-decoder PDCR and a plurality of NAND gates for decoding represented by a NAND gate circuit NAG 0. Here, the pre-decoder PDCR receives lower 2-bit complementary internal address signals $\overline{ax0}$ and $\overline{ax1}$ (where an internal address signal such as ax0 having the same phase as an external address signal AX0, and an internal address signal such as $\overline{ax0}$ having an opposite phase to the phase of the external address signal AX0 are together expressed as complementary internal address signal ax0), for example, and generates selection signals $\phi x0 \sim \phi x3$. As represented typically by the NAND gate circuit NAG 0 in FIG. 5, each NAND gate circuit consists of a plurality of N-channel MOSFETs $Q_{g2} \sim Q_{g3}$ which are connected in series to receive complementary internal address signals ax2~axi combined with one another in such a manner as to correspond to the gates of these transistors, and a P-channel MOSFET $Q_{g1}$ and an N-channel MOSFET $Q_{g4}$ disposed between these MOSFETs $Q_{g2}$, $Q_{g3}$ and a power source voltage $V_{cc}$ and ground potential of the circuit, respectively.

As represented by word lines W0~W3, each word line of a memory array M-ARY is connected to a word line drive circuit corresponding thereto. These word line drive circuits each consist of a P-channel MOSFET $Q_{d1}$ and an N-channel MOSFET $Q_{d2}$ connected in a CMOS inverter circuit arrangement. Four word line drive circuits are connected to each decoding NAND gate circuit of the X address decoder XDCR. Each word line drive circuit has the function of a part of the X address decoder XDCR when the corresponding selection signal $\phi x0 \sim \phi x3$ is supplied from the pre-decoder PDCR described above to the source of the P-channel MOSFET $Q_{d1}$ constituting that word line drive circuit.

SUMMARY OF THE INVENTION

However, the inventors of the present invention have clarified as a result of their studies that the following problem develops in the static X address decoder of the kind described above when the memory capacity of CMOS static RAMS is increased. The parasitic capacitance connected to each word line increases with the increase in the memory capacity of the CMOS static RAM, and the rise of the voltage level of the word line which is brought into the selection state is delayed. If the sizes of MOSFETs $Q_{d1}$ and $Q_{d2}$ are increased to increase the driving capacity of the word line drive circuit in order to cope with the problem described above, the drain capacitance as well as gate capacitance of these MOSFETs become great and loads on the pre-decoder PDCR and on the decoding NAND gate circuit increase, too. The influence of the increase of the loads becomes particularly remarkable in the decoding NAND gate circuit in which a plurality of MOSFETs are connected in series, and this is one of the factors that prevent a higher operation speed of static RAMs.

It is therefore an object of the present invention to provide a semiconductor memory device such as a CMOS static RAM which speeds up the selection operation of the X address decoder and the operation speed of memory access.

The above and other objects and novel features of the present invention will become more apparent from the following description when taken in conjunction with the accompanying drawings.

Among the inventions disclosed herein, the following will illustrate a typical example.

A capacitance cut MOSFET is provided for receiving a corresponding output signal of a pre-decoder, for example, at its gate. This capacitance(cut MOSFET is disposed between a decoding logic gate circuit of an X address decoder and each word line drive circuit. It should be noted that the term "capacitance cut MOSFET" means a MOSFET provided to reduce the capacitive load of a circuit which it is coupled to the output of (e.g., in this case, for cutting the capacitive load of the decoding logic gate and the pre-decoder). In addition, a reset MOSFET is provided which is connected at its source, for example, to the power source voltage of the circuit and receives at its gate a selection control signal. This reset MOSFET is disposed at the input terminal of each word line drive circuit.

According to the means described above, since the capacitance cut MOSFET is disposed in such a manner as to correspond to each word line drive circuit, drivability of the word line drive circuit can be increased without increasing loads on the output signals of the pre-decoder and on the decoding logic gate circuit, that is, without exerting any undesirable influences on the selection operation of the X address decoder. Accordingly, it becomes possible to increase the memory capacity of a semiconductor memory device such as a CMOS static RAM and to attain its higher operation speed.

DESCRIPTION OF THE PREFERRED EMBODIMENTS

Embodiment 1

Figure 4:
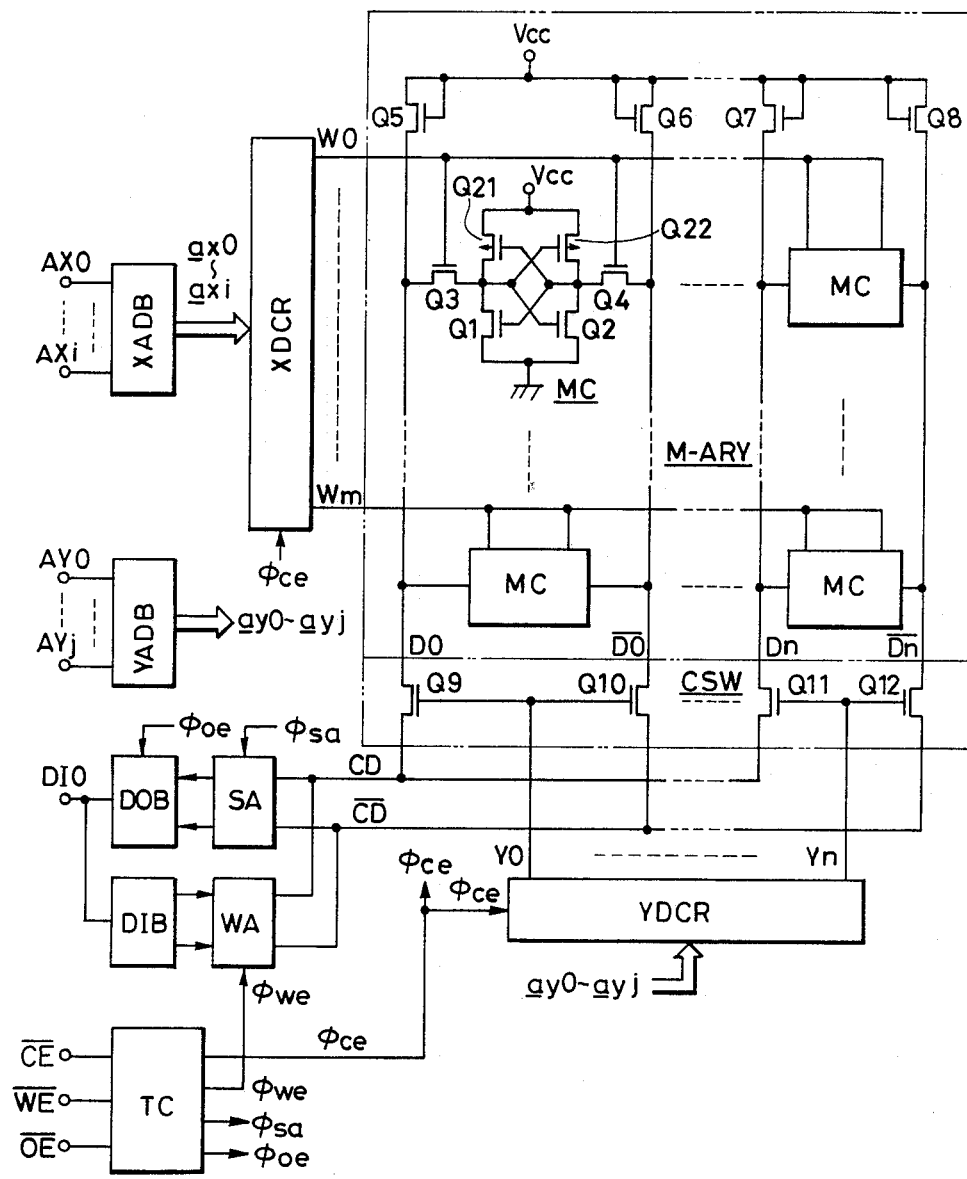
FIG. 4 is a block circuit diagram showing one embodiment of the static RAM in accordance with the present invention.
Figure 5:
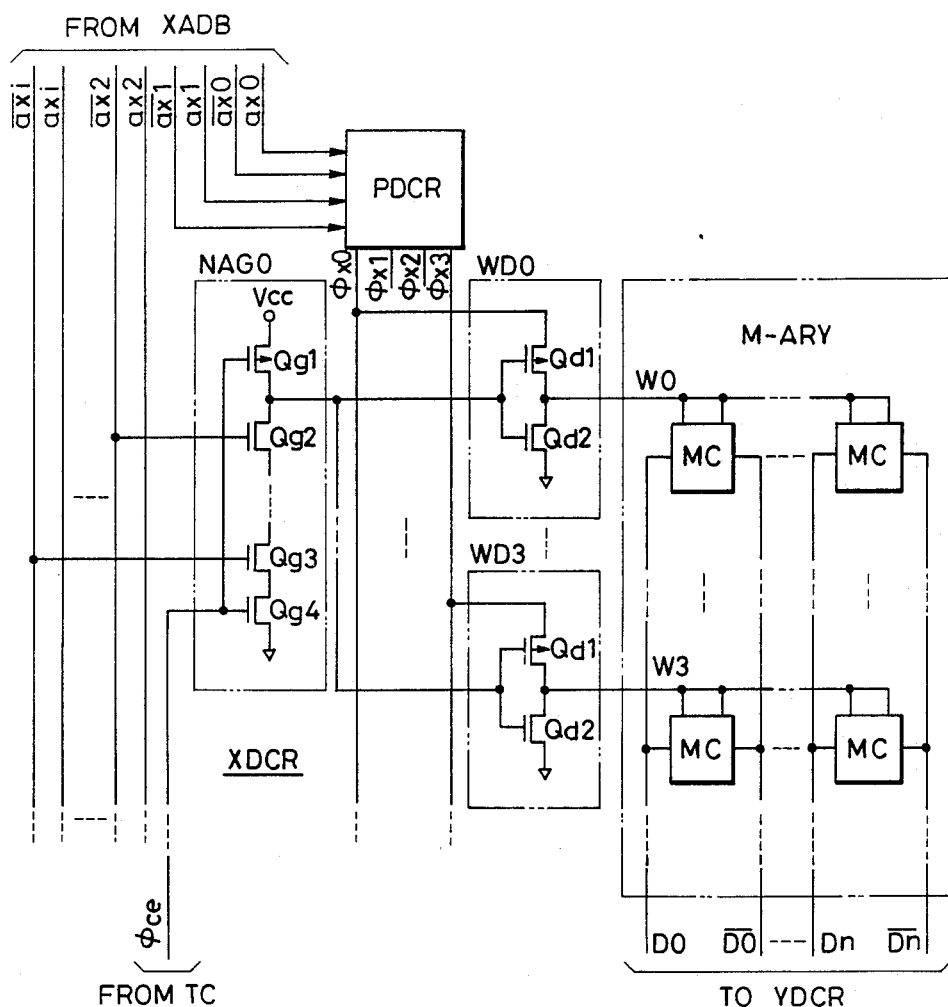
FIG. 5 is a circuit diagram showing an example of an X address decoder of a conventional static RAM.

FIG. 4 shows a block circuit diagram of a CMOS static RAM in accordance with the first embodiment of the present invention. Each circuit element of the drawing is formed on one semiconductor substrate such as single crystal silicon by known fabrication technique of CMOS integrated circuits, though not particularly limitative. In the drawings to follow, MOSFETs represented by an arrow at their channel (back gate) are of a P-channel type while MOSFETs not having the arrow are of an N-channel type.

In FIG. 4, a memory array M-ARY consists of m+1 word lines $W0 \sim Wm$, n+1 complementary data lines $D0 \cdot \overline{D0} \sim Dn \cdot \overline{Dn}$ and $(m+1) \times (n+1)$ memory cells disposed at the points of intersection of these word lines and complementary data lines.

Though not particularly limitative, each memory cell consists fundamentally of two sets of CMOS inverter circuits consisting in turn of a P-channel MOSFET Q21 and an N-channel MOSFET Q1 and a P-channel MOSFET Q22 and an N-channel MOSFET Q2. The input and output terminals of these CMOS inverter circuits are cross-connected with each other in the latch form and constitute a flip-flop as a memory device of this CMOS static RAM.

The drains of MOSFETs Q21 and Q1 and the drains of MOSFETs Q22 and Q2 that are connected in common are used as the input and output nodes of this flip-flop and further connected to the corresponding complementary data lines $D0 \cdot \overline{D0}$ through N-channel transfer gate MOSFETs Q3 and Q4, respectively. The gates of these transfer gate MOSFETs Q3 and Q4 are connected in common to the corresponding word line W0.

The other memory cells MC have the same circuit construction as described above and are connected likewise to the corresponding data and word lines, thereby forming a memory cell matrix and a memory array M-ARY. In other words, the input/output nodes of the memory cells MC disposed on the same row are connected to the corresponding complementary data lines $D0 \cdot \overline{D0} \sim Dn \cdot \overline{Dn}$ through the corresponding transfer gate MOSFETs, and the gates of transfer gate MOSFETs of the memory cells MC disposed on the same column are connected in common to the corresponding word lines $W0 \sim Wm$, respectively.

As shown typically in FIG. 4, N-channel type load MOSFET pairs $Q5 \cdot Q6 \sim Q7 \cdot Q8$ are disposed between the complementary data lines $D0 \cdot \overline{D0} \sim Dn \cdot \overline{Dn}$ and the power source voltage Vcc of the circuit.

The word lines $W0 \sim Wm$ are connected to the X address decoder XDCR. Complementary internal address signals $ax0 \sim axi$ (an internal address signal such as ax0 having the same phase as an external address signal AX0, and an internal address signal $\overline{ax0}$ having the opposite phase to the phase of an external address signal AX0 will be hereinafter expressed together as the complementary internal address signal ax0) from an X address buffer ADB are supplied to this X address decoder XDCR. A timing signal $\phi ce$ (a selection control signal) is supplied, too, from a later-discussed timing control circuit TC to the X address decoder XDCR. This timing signal $\phi ce$ is generated in accordance with a chip enable signal $\overline{CE}$ supplied as a control signal from outside and is kept at a high level under the selection state of this CMOS static RAM. As will be described later, the X address decoder XDCR is selectively actuated by the timing control signal $\phi ce$, decodes the complementary internal address signals $ax0 \sim axi$ and sets one of the word lines designated by the X address signals $AX0 \sim AXi$ to the high level selection state.

The definite circuit construction and operation of the X address decoder will be described later in further detail.

The X address buffer XADB receives the X address signals $AX0 \sim AXi$ supplied through external terminals $AX0 \sim AXi$ and generates the complementary internal address signals $ax0 \sim axi$ on the basis of these signals $AX0 \sim Axi$ and supplies them to the X address decoder XDCR.

On the other hand, the complementary data lines $D0 \cdot \overline{D0} \sim Dn \cdot \overline{Dn}$ of the memory array M-ARY are connected selectively to the complementary common data lines $CD \cdot \overline{CD}$ through the corresponding switch MOSFET pairs $Q9 \cdot Q10 \sim Q11 \cdot Q12$ of the column switch SW, respectively. The gates of these switch MOSFET pairs $Q9 \cdot Q10 \sim Q11 \cdot Q12$ are connected in common and the corresponding data line selection signals $Y0 \sim Yn$ are supplied thereto from the Y address decoder YDCR.

Y address decoder YDCR generates data line selection signals $Y0 \sim Yn$ for selecting one set of complementary data lines and for connecting them to the complementary common data lines $CD \cdot \overline{CD}$ by decoding the complementary internal address signals $ay0 \sim ayj$ supplied from the Y address buffer YADB. This Y address decoder YDCR is operated selectively in accordance with the timing signal $\phi ce$ supplied from the timing control circuit TC in the same way as the X address decoder XDCR.

The complementary common data lines $CD \cdot \overline{CD}$ are connected to the input terminals of a sense amplifier SA and to the output terminals of a write amplifier WA. The output terminals of the sense amplifier SA are connected to the input terminals of a data output buffer DOB while the input terminals of the write amplifier WA are connected to the output terminals of a data input buffer DIB.

The sense amplifier SA is operated selectively in accordance with the timing signal $\phi sa$ supplied from the timing control circuit TC and amplifies the read signal outputted from the selected memory cell MC through the complementary common data lines $CD \cdot CD$. The output signal of the sense amplifier SA is supplied to the data output buffer DOB.

The data output buffer DOB is operated selectively in accordance with the timing signal $\phi oe$ supplied from the timing control circuit TC in the read mode of CMOS static RAM. The data output buffer DOB further amplifies the read signal of the memory cell outputted from the sense amplifier SA and delivers it to external devices through the input/output terminals DIO. The output of the data output buffer DOB is in a high impedance state under the non-selection state of CMOS static RAM in which the timing signal $\phi oe$ is at the low level and in the write mode.

On the other hand, the data input buffer DOB supplies write data supplied from an external device through the input/output terminals DIO to a write amplifier WA as a complementary write signal in the write mode of CMOS static RAM.

In the write mode of CMOS static RAM, the write amplifier is operated selectively in accordance with the timing signal $\phi we$ supplied from the timing control circuit TC. The write amplifier WA supplies a write current, which relies on the complementary write signals supplied from the data input buffer DIB, to the selected memory cell MC through the complementary common data lines CD·$\overline{CD}$. The output of the write amplifier WA is in a high impedance state under the non-selection state of CMOS static RAM where the timing signal $\phi$we is at the low level, and in its read mode.

The timing control circuit TC generates various timing signals described above on the basis of a chip enable signal $\overline{CE}$, a write enable signal $\overline{WE}$ and an output enable signal $\overline{OE}$ supplied as control signals from outside, and supplies each timing signal to each circuit in the manner described above.

Figure 1:
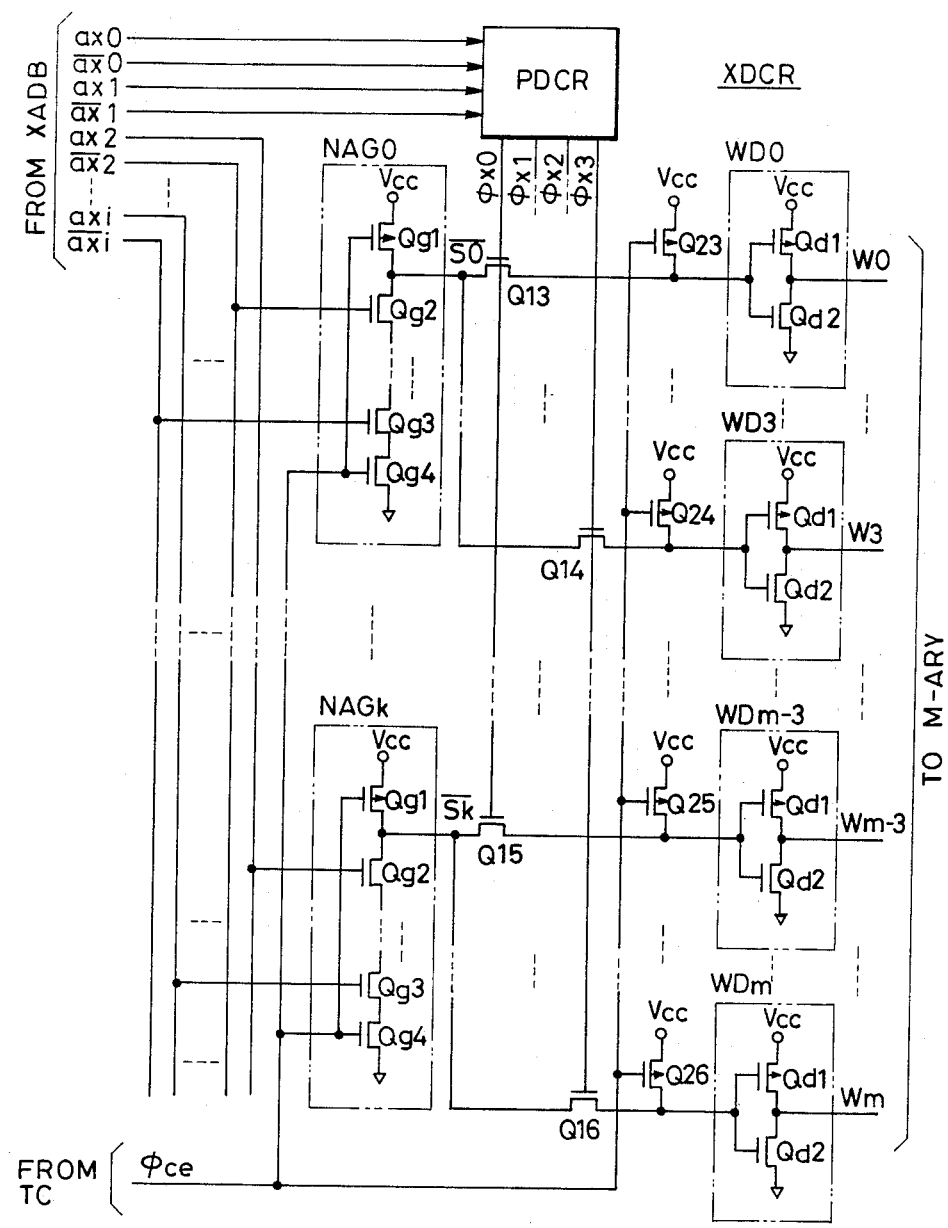
FIG. 1 is a circuit diagram showing an X address decoder of a static RAM in accordance with the first embodiment of the present invention.

FIG. 1 shows a circuit diagram of one example of the X address decoder XDCR of the CMOS static RAM shown in FIG. 4.

In FIG. 1, the X address decoder XDCR of the CMOS static RAM includes the pre-decoder PDCR which receives the lower 2-bit complementary internal address signals $\underline{ax0}$ and $\underline{ax1}$ and k+1 decoding NAND gate circuits NAG0~NAGk to which the complementary internal address signals ax2~axi other than the lower two bits in respective combinations are supplied, though the circuit configuration is not particularly limitative.

The pre-decoder PDCR decodes the lower 2-bit complementary internal address signals $\underline{ax0}$ and $\underline{ax1}$ supplied thereto from the X address buffer XADB and generates selection signals $\phi$x0~$\phi$x3. These selection signals $\phi$x0~$\phi$x3 are formed selectively in accordance with the complementary internal address signals ax0 and $\underline{ax1}$. In other words, the selection signal $\phi$x0 is set to the high logic level when both the inversed internal address signals $\overline{ax0}$ and $\overline{ax1}$ are at the high logic level. Similarly, the selection signals $\phi$x1, $\phi$x2 and $\phi$x3 are set to the high logic level when both the non-inversed internal address signal ax0 and the inversed internal address signal $\overline{ax1}$ are at the high logic level, when both the inversed internal address signal $\overline{ax0}$ and non-inversed internal address signal ax1 are at the high logic level and when both the non-inversed internal address signals ax0 and ax1 are at the high logic level, respectively.

On the other hand, each of the decoding NAND gate circuits NAG0~NAGk consists of a P-channel MOSFET Qg1, N-channel MOSFETs Qg2, Qg3 and N-channel MOSFET Qg4 disposed in series between the power source voltage Vcc of the circuit and the ground potential. The gates of MOSFETs Qg1 and Qg4 are connected in common and the timing signal $\phi$ce (selection control signal) described above is supplied to them. The complementary internal address signals $\underline{ax2}$~$\underline{axi}$ in the corresponding combinations are applied to the gates of MOSFETs Qg2~Qg3. In other words, the inversed internal address signals $\overline{ax2}$~$\overline{ax1}$ are all applied to the gates of MOSFETs Qg2~Qg3 of the NAND gate circuit NAG 0 and the non-inversed internal address signals ax2~axi are all supplied to the gates of MOSFETs Qg2~Qg3 of the NAND gate circuit NAG k. Similarly, the complementary internal address signals $\underline{ax2}$-~$\underline{axi}$ which are combined in such a manner as to be the binary number corresponding to the number of the respective NAND gate circuit using the complementary internal address signal $\underline{ax2}$ as the lowermost bit are supplied to the gates of MOSFETs Qg2~Qg3 of the NAND gate circuits NAG1~NAGk-1.

Accordingly, the output signal of the NAND gate circuit NAG0, that is, the inversed selection signal $\overline{S0}$, is ordinarily at the high logic level under the non-selection state of CMOS static RAM, and is set to the low logic level in synchronism with the timing signal $\phi$ce when all the inversed internal address signals $\overline{ax2}$~$\overline{axi}$ are at the high logic level. In other words, the inversed selection signal $\overline{S0}$ is at the low logic level when the CMOS static RAM is under the selection state and any one of the word lines W0 through W3 is designated by the X address signal AX0-AXi. Similarly, the output signal of the NAND gate circuit NAGk, that is, the inversed selection signal $\overline{Sk}$, is at the low logic level in synchronism with the timing signal $\phi$ce when all the non-inversed internal address signals ax2~axi are at the high logic level. In other words, the inversed selection signals $\overline{Sk}$ is at the low logic level when CMOS static RAM is under the selection state and any one of the word lines Wm-3~Wm is designated by the X address signal AX0~AXi. The output signals of the NAND gate circuits NAG1~NAGk-1, that is, the inversed selection signals $\overline{S1}$~$\overline{Sk-1}$, which are not shown in the drawing, are generated by the same logic as described above.

(m+1) word line drive circuits WD0~WDm are disposed in the X address decoder XDCR of this CMOS static RAM in such a manner as to correspond to the word lines W0~Wm of the memory array M-ARY. As represented typically by the word line drive circuits WD0, WD3, WDm-3 and WDm shown in FIG. 1, these word line drive circuits WD0~WDm each comprise a CMOS inverter circuit which consists of a P-channel MOSFET Qd1 and an N-channel MOSFET Qd2. In order to provide a CMOS static RAM with a relatively large memory capacity, a relatively large memory capacitance consisting primarily of the gate capacitance of the transfer gate MOSFET of the memory cell is connected to each word line W0~Wm of the memory array M-ARY. For this reason, MOSFETs Qd1 and Qd2 have a relatively large conductance and each word line drive circuit WD0~Wdm is designed to have relatively large drivability.

The selection signals $\overline{S0}$~$\overline{Sk}$ generated by the NAND gate circuits NAG0~NAGk are supplied to the corresponding four sets of word line drive circuits WD0~WD3 or WDm-3~WDm through the corresponding capacitance cut MOSFETs Q13~Q14 or Q15~Q16, respectively. Among the four capacitance cut MOSFETs of each set, the selection signal $\phi$x0 is supplied in common from the pre-decoder PDCR to the gate of the first MOSFET represented by MOSFETs Q13 and Q15, and the selection signal $\phi$x3 is supplied in common to the gate of the fourth MOSFET represented by MOSFETs Q14 and Q16. Similarly, the selection signals $\phi$x1 and $\phi$x2 are supplied in common from the pre-decoder PDCR to the gates of the second and third MOSFETs among the four capacitance cut MOSFETs of each set, respectively. Accordingly, the inversed selection signal $\overline{S0}$~$\overline{Sk}$ of the low logic level is transmitted to only the word line drive circuit corresponding to one word line that is designated by the X address signal Ax0~Axi.

These capacitance cut MOSFETs Q13~Q16 are disposed between the output terminals of the decoding NAND gate circuits NAG0~NAGk and the input terminals of the word line drive circuits WD0~WDm; hence the level of the input terminal of each word line drive circuit under the non-selection state is in the floating state. To prevent this, a P-channel reset MOSFET Q23~Q24 or Q25~Q26 is disposed between the input terminal of each word line drive circuit and the power source voltage Vcc of the circuit. The timing signal $\phi ce$ described above is supplied in common to the gates of these reset MOSFETs. These reset MOSFETs Q23~Q24 or Q25~Q26 are turned ON together under the non-selection state of the CMOS static RAM where the timing signal $\phi ce$ is at the low logic level, and set the level of the input terminals of the corresponding word line drive circuits WD0~WDm to the high logic level. Accordingly, the output terminal of each word line drive circuit, that is, the level of the word line W0~Wm, is fixed at the low level non-selection state. When the CMOS static RAM is brought into the selection state and the timing signal $\phi ce$ rises to the high logic level, the reset MOSFETs Q23~Q24 or Q25~Q26 are turned OFF. At this time, the inversed selection signal of the low logic level is supplied to the word line drive circuit corresponding to the word line which is designated by the X address signal AX0~AXi. Therefore, the output terminal of this word line drive circuit, that is, the designated word line, is under the high level selection state. On the other hand, the input terminals of the word line drive circuits which are not under the selection state are in the floating state because both the corresponding reset MOSFET and capacitance cut MOSFET are OFF. However, since the time in which CMOS static RAM is under the selection state is short, the corresponding word line keeps the non-selection state due to the high level charge built up in the gate capacitance of MOSFETs Qd1 and Qd2 of each word line drive circuit.

As described above, in the X address decoder of CMOS static RAM of this embodiment, capacitance cut MOSFETs for receiving the selection signals $\phi 0 \sim \phi x3$ of the pre-decoder PDCR are disposed between the decoding NAND gate circuits and the four sets of word line drive circuits corresponding thereto. Moreover, reset MOSFETs for receiving the timing signal $\phi ce$ (selection control signal) are disposed between the input terminal of each word line drive circuit and the power source voltage Vcc of the circuit. Accordingly, the load to the output signal of the pre-decoder PDCR, that is, the load to the selection signal $\phi x0 \sim \phi x3$, is only the capacitance cut MOSFET having a relatively small conductance, while the load to the output signal of each decoding NAND gate circuit, that is, the load to the inversed selection signal $\overline{S0} \sim \overline{Sk}$, is only one word line drive circuit connected through a corresponding capacitance cut MOSFET. In other words, the loads to the output signals of the predecoder PDCR and decoding NAND gate circuit are not much affected, even though a relatively large parasitic capacitance is connected to each word line of the memory array M-ARY and the side of MOSFETs Qd1 and Qd2 constituting the word line drive circuit is relatively large due to the large memory capacity of CMOS static RAM. Therefore, the selection operation of the X address decoder XDCR is sped up and memory access of the CMOS static RAM is sped up, too.

Embodiment 2

Figure 2:
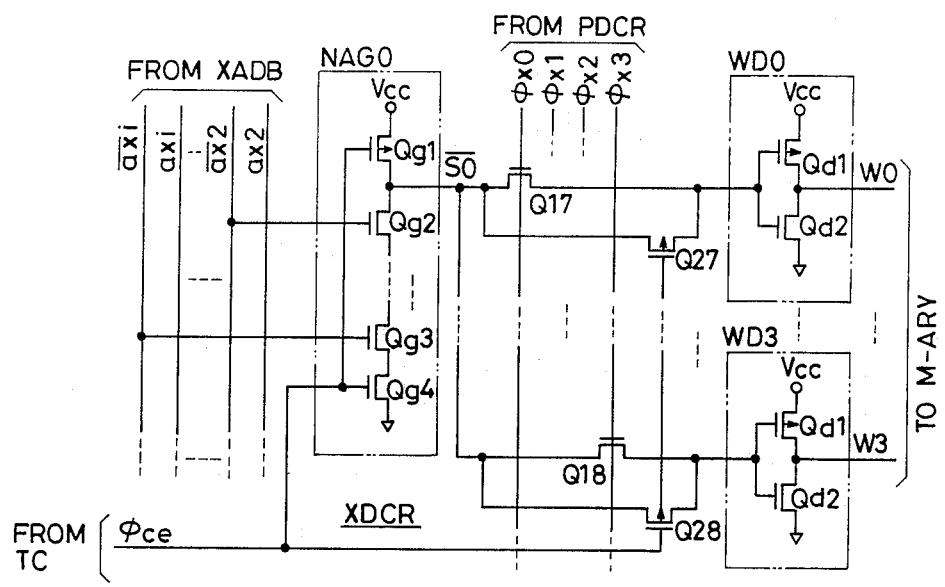
FIG. 2 is a circuit diagram showing the X address decoder of the static RAM in accordance with the second embodiment of the present invention.

FIG. 2 shows the circuit diagram of the X address decoder XDCR of a CMOS static RAM in accordance with the second embodiment of the present invention. The drawing illustrates partially the NAND gate circuit NAG0, the word line drive circuits WD0~Wd3 and associated circuits of the X address decoder XDCR. Therefore, refer to the circuits described in the first embodiment for the detail of the circuits which are not shown. Furthermore, among the circuits shown in the drawing, the construction and operation of the same circuit portions as those of the first embodiment will not be explained.

In FIG. 2, the X address decoder XDCR of the CMOS static RAM of this embodiment includes one pre-decoder PDCR and k+1 decoding NAND gate circuits NAG0~NAGk in the same way as in the first embodiment described already. The word line drive circuits WD0~WDm are disposed in such a manner as to correspond to the word lines W0~Wm of the memory array M-ARY.

In the X address decoder XDCR of this embodiment, N-channel capacitance cut MOSFETs Q17~Q18 for receiving the corresponding selection signals $\phi x0 \sim \phi x3$ at their gates from the pre-decoder PDCR are disposed between the decoding NAND gate circuit NAG0 and the corresponding four sets of word line drive circuits WD0~Wd3. These selection signals $\phi x0 \sim \phi x3$ are generated in accordance with the same logic condition as that of the first embodiment.

P-channel reset MOSFETs Q27~Q28 are juxtaposed with the capacitance cut MOSFETs Q17~Q18, respectively. The gates of these reset MOSFETs Q27~Q28 are connected in common and receive the afore-mentioned timing signal $\phi ce$ from the timing control circuit TC.

The pre-decoder PDCR, the decoding NAND gate NAG0, the word line drive circuits WD0~WD3 and the capacitance cut MOSFETs Q17~Q18 perform the same selection operation as that of the first embodiment and bring one word line designated by the X address signal AXO~Axi to the high level selection state.

The reset MOSFETs Q27~Q28 are turned ON together when the CMOS static RAM is under the non-selection state and the timing signal $\phi ce$ is at the low logic level. In this instance, the input terminal of each word line drive circuit WD0~WD3 is connected to the output terminal of the corresponding NAND gate circuit NAG0 through the corresponding reset MOSFET Q27~Q28. As described already, P-channel MOSFET Qg1 for receiving the timing signal $\phi ce$ at its gate is disposed between the output terminal of the NAND gate circuit NAG0 and the power source voltage of the circuit. This MOSFET Qg1 is turned ON together with reset MOSFETs Q27~Q28 when the CMOS static RAM is under the non-selection state and the timing signal $\phi ce$ is at the low logic level. Therefore, the input terminal of each word line drive circuit is fixed to the high logic level by the power source voltage Vcc of the circuit which is supplied through this MOSFET Qg1 and the corresponding reset MOSFET. Since the input terminal of each word line drive circuit is at the high logic level, its output signal, that is, the word line W0~Wm, is fixed to the low level non-selection state.

On the other hand, when this CMOS static RAM is under the selection state and the timing signal $\phi ce$ is at the high logic level, all the reset MOSFETs Q27~Q28 are turned OFF, so that the corresponding selection signal $\phi x0 \sim \phi x3$ of the pre-decoder PDCR rises to the high logic level and the inversed selection signal the corresponding NAND circuit is transmitted to only the word line drive circuit whose corresponding capacitance cut MOSFET is turned ON. When the corresponding selection signal $\phi x0 \sim \phi x3$ of the pre-decoder PDCR is at the low logic level, reset MOSFETs and capacitance cut MOSFETs are turned OFF simultaneously and the level of the input terminal of the corresponding word line drive circuit is in the floating state.

However, in the same way as in the first embodiment, since the time in which the CMOS static RAM is under the selection state is short, the corresponding word line keeps the low level non-selection state due to the high level charge which is built up in the gate capacitance of MOSFETs Qd1 and Qd2 of each word line drive circuit.

As described above, capacitance cut MOSFETs for receiving the selection signals $\phi x0 \sim \phi x3$ of the pre-decoder PDCR are disposed between the decoding NAND gate circuits and the corresponding four sets of word line drive circuits in the X address decoder XDCR of CMOS static RAM of this embodiment. Reset MOSFETs for receiving the timing signal $\phi ce$ (selection control signal) at their gates are disposed for these capacitance cut MOSFETs, respectively. Accordingly, in the same way as in the first embodiment, the load to the output signal of the pre-decoder PDCR, that is, the load to the selection signal $\phi x0 \sim \phi x3$, is only the capacitance cut MOSFET having a relatively small conductance and the load to the output signal of each decoding NAND gate circuit, that is, the load to the inversed selection signal $\overline{S0} \sim \overline{Sk}$, is only one word line drive circuit connected through the capacitance cut MOSFET. Therefore, even though the CMOS static RAM has a large memory capacity, the selection operation of the X address decoder XDCR is sped up and the memory access of CMOS static RAM is sped up, as well.

Embodiment 3

Figure 3:
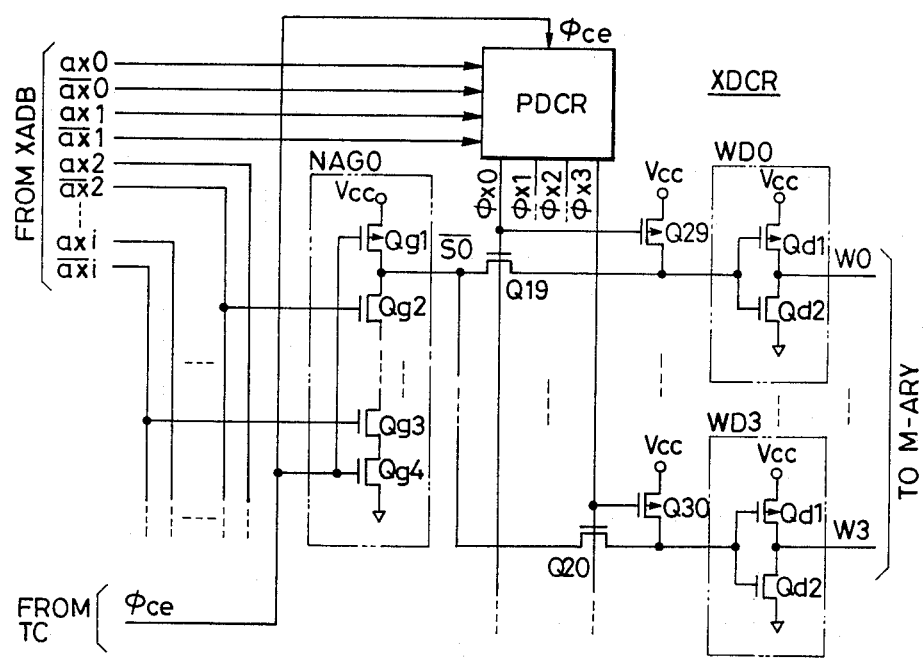
FIG. 3 a circuit diagram showing the X address decoder of the static RAM in accordance with the third embodiment of the present invention.

FIG. 3 shows the circuit diagram of the X address decoder XCDR of the CMOS static RAM in accordance with the third embodiment of the present invention. The drawing shows only the NAND gate circuit NAG0, the word line drive circuits WD0 and associated circuits of the X address decoder XDCR in the same way as in the second embodiment. Refer to the circuits shown in the first and second embodiments for the detail of those circuit portions which are not shown in the drawing. Furthermore, the explanation of the construction and operation of the same circuit portions as those of the first and second embodiments will be omitted.

In FIG. 3, the X address decoder XDCR of the CMOS static RAM of this embodiment includes one pre-decoder PDCR and k+1 decoding NAND gate circuits NAG0 ~ NAGk in the same way as in the foregoing embodiments. Word line drive circuits WD ~ WDm are also disposed in such a manner as to correspond to the word lines W0 ~ Wm of the memory array M-ARY, respectively.

In the X address decoder XDCR of this embodiment, the afore-mentioned timing signal $\phi ce$ (selection control signal) is supplied to the pre-decoder PDCR. Accordingly, the CMOS static RAM is brought into the selection state and the timing signal $\phi ce$ is set to the high logic level so that the output signal of the pre-decoder PDCR, that is, the selection signal $\phi x0 \sim \phi x3$, is set selectively to the high logic level.

N-channel capacitance cut MOSFETs Q19 ~ Q20 for receiving the corresponding selection signals $\phi x0 \sim \phi x3$ from the pre-decoder PDCR at their gates are disposed between the decoding NAND gate circuit NAG0 and the corresponding four sets of word line drive circuits WD0 ~ WD3. P-channel reset MOSFETs Q29 ~ Q30 are disposed between the input terminal of each word line drive circuit and the power source voltage Vcc of the circuit. The gates of these reset MOSFETs Q29 ~ Q30 are connected in common to the gates of the corresponding capacitance cut MOSFET Q19 ~ Q20, and the corresponding selection signals $\phi x0 \sim \phi x3$ are supplied to them, respectively.

Reset MOSFETs Q29 ~ Q30 are turned ON when the corresponding selection signals $\phi x0 \sim \phi x3$ of the pre-decoder PDCR are at the low logic level and the corresponding word line drive circuits are under the non-selection state, and set the input terminals of the word line drive circuits to the high logic level. When the corresponding selection signals $\phi x0 \sim \phi x3$ of the pre-decoder PDCR are at the high logic level, these reset MOSFETs are turned OFF but since corresponding capacitance cut MOSFETs are turned ON complementarily, the level of the input terminals of the corresponding word line drive circuits is determined by the level of the output signals of the corresponding word line drive circuits. In other words, in the case of this embodiment, since each reset MOSFET and corresponding capacitance cut MOSFET are turned ON complementarily, the level of the input terminal of each word line drive circuit does not enter the floating state. For this reason, the output signal of each word line drive circuit, that is, the level of the word lines W0 ~ Wm of the memory array M-ARY, become stabilized.

As described above, capacitance cut MOSFETs for receiving the selection signals $\phi x0 \sim \phi x3$ of the pre-decoder PDCR are disposed between the decoding NAND gate circuit and the corresponding four sets of word line drive circuits in the X address decoder of the CMOS static RAM of this embodiment, respectively. Reset MOSFETS whose gates are connected in common to the gates of the corresponding capacitance cut MOSFETs are disposed between the input terminal of each word line drive circuit and the power source voltage Vcc of the circuit. The timing signal $\phi ce$ described above is supplied to the pre-decoder PDCR and its output signal, that is, the selection signal $\phi x0 \sim \phi x3$, is generated in accordance with this timing signal $\phi ce$. Therefore, a reset MOSFET is turned ON complementarily with a capacitance cut MOSFET and the level of the input terminal of each word line drive circuit is secured to the high logic level in accordance with the power source voltage Vcc supplied through the corresponding reset MOSFET or to the logic level in accordance with the output signal of the corresponding NAND gate circuit supplied through the capacitance cut MOSFET. For this reason, in addition to the effect of improving the selection speed in the same way as in the first embodiment, this embodiment provides the effect that the output level of the word line drive circuit, that is, the level of the word line W0 ~ Wm, is secured to the stable low or high logic level and the selection operation of the X address decoder XDCR is stabilized.

As represented by the foregoing embodiments, the present invention provides the following effect when applied to semiconductor memory devices such as static RAMs having a clocked static type X address decoder.

(1) Since capacitance cut MOSFETs for receiving the corresponding output signals of the pre-decoder at their gates are disposed between the decoding logic gate circuits of the X address decoder and each word line drive circuit, the loads to the decoding logic gate circuits and to the output signals of the pre-decoder can be reduced.

(2) Drivability of each word line drive circuit can be improved due to the effect (1) without increasing the loads to the decoding logic gate circuits and to the output signals of the pre-decoder, that is, without adversely affecting the selection operation of the X address decoder.

(3) Due to the effects (1) and (2), the memory capacity can be increased without affecting adversely the selection operation of the X address decoder, and a semiconductor memory device such as a CMOS static RAM having a large memory capacity and a higher memory access speed can be accomplished.

(4) In the items (1) through (3) described above, since a reset MOSFET whose source is connected to the power source voltage of the circuit and which receives the selection control signal at its gate, for example, is disposed at the input terminal of each word line drive circuit, the capacitance cut MOSFET is turned OFF under the non-selection state of the static RAM or under the non-selection state of the corresponding word line drive circuit. Accordingly, it is possible to prevent unstability of the level of the input terminal of each word line drive circuit.

(5) In the item (4) described above, if the selection control signal is added to the logic condition of the output signal of the pre-decoder and the gate of a reset MOSFET disposed between the input terminal of each word line drive circuit and the power source voltage of the circuit, for example, is connected in common to the gate of capacitance cut MOSFET so as to turn ON both reset MOSFET and capacitance cut MOSFET complementarily with each other, it becomes possible to prevent floating of the level of the input terminal of each word line drive circuit and to further stabilize the selection operation of the X address decoder.

Although the present invention has thus been described definitely with reference to some preferred embodiments thereof, the invention is not particularly limited thereto but can be changed or modified in various manners without departing from the scope and spirit thereof. For example, the decoding NAND gate circuits shown in FIGS. 1 to 3 may be ordinary NAND gate circuits wherein a plurality of parallel P-channel MOSFETs whose gates are connected in common to the gates of corresponding MOSFETs Qg2~Qg3 are disposed between the output node and the power source voltage of the circuit. In addition, these decoding logic gate circuits need not necessarily be NAND gate circuits but may be other logic gate circuits such as NOR gate circuits. In FIG. 2, capacitance cut MOSFETs and reset MOSFETs can be turned ON complementarily with each other by adding the timing signal $\phi ce$ to the logic condition of the selection signals $\phi x0 \sim \phi x3$ of the pre-decoder PDCR and by connecting in common the gates of reset MOSFETs Q27~Q28 to the gates of capacitance cut MOSFETs Q17~Q18. The pre-decoder PDCR may be of such a type which decodes the address signal of at least three lower bits. Also, the logic level of the selection signal $\phi x0 \sim \phi x3$ may be ordinarily at the high level and change to the low level at the time of selection. In such a case, the conductivity type of the capacitance cut MOSFET and reset MOSFET needs to be changed in accordance with the logic level. Furthermore, various other forms may be employed for the block construction of the static RAM shown in FIG. 4 or for the combination of the control signals.

Although the description given above deals primarily with the application of the invention to a static RAM as the background and field of utilization of the present invention, the invention is not particularly limited to such an application but can be applied to dynamic RAMs or other semiconductor memory devices as well. The present invention can be applied widely to semiconductor memory devices having at least a clocked static type address decoder and semiconductor devices with built-in semiconductor memory devices of the type described above.

Among the inventions disclosed herein, the following will illustrate a typical example of the effects brought forth. Capacitance cut MOSFETs for receiving the corresponding output signals of the pre-decoder at their gates, for example, are disposed between the decoding logic gate circuits of the X address decoder and each word line drive circuit. Reset MOSFETs for receiving the selection control signal at their gates, for example, and which are connected to the power source voltage of the circuit at their sources, for example, are disposed at the input terminals of the word line drive circuits. According to this circuit construction, drivability of the word line drive circuits can be increased without increasing the loads to the decoding logic gate circuits and to the output signals of the pre-decoder. Therefore, semiconductor memory devices such as CMOS static RAMs having a large memory capacity and high memory access speed can be accomplished.

What is claimed is:

1. A semiconductor memory device comprising:
    a memory array having a plurality of word lines, a plurality of data lines formed to intersect with said plurality of word lines and a plurality of memory cells formed at intersections of said word lines and said data lines;
    a first word line driver for driving at least a first one of said word lines;
    a second word line driver for driving at least a second one of said word lines;
    a first logic decoding means coupled to receive a first group of address signals, and including means for providing an output signal at an output terminal in accordance with said first group of address signals;
    a first switch for coupling said output terminal of said first logic decoding means to an input of the first word line driver;
    a second switch for coupling said output terminal of said first logic decoding means to an input of the second word line driver; and
    a second logic decoding means coupled to receive a second group of address signals, and including means for selectively activating a predetermined one of said first switch and said second switch based on said second group of address signals to selectively connect the output terminal of said first logic decoding means to one of the input terminals of said first word line driver and said second word line driver,
    wherein said first switch comprises a MOSFET having a source-drain path coupled in series between the output terminal of the first logic decoding means and the input of said first word line driver and having a gate coupled to receive an output control signal generated by said second logic decoding means, and wherein said second switch comprises a MOSFET having a source-drain path coupled in series between the output terminal of the first logic decoding means and the input of the second word line driver and having a gate coupled to receive an output control signal generated by said second logic decoding means.

2. A semiconductor memory device according to claim 1, further comprising first reset means coupled to the input of the first word line driver to set an input signal level of said first word line driver to a predetermined non-selection level, and a second reset means coupled to the input of the second word line driver to set an input signal level of the second word line driver to a predetermined non-selection level.

3. A semiconductor memory device according to claim 2, wherein said first and second reset means each comprise a MOSFET having a source-drain path coupled between a predetermined power source voltage and said inputs of said first and second word line drivers, respectively, and each further having a gate coupled to receive a signal indicating whether the memory array is in a non-selection mode.

4. A semiconductor memory device according to claim 2, wherein said first reset means comprises a MOSFET having a source-drain path coupled between the output terminal of the first logic decoding means and the input of the first word line driver, wherein said second reset means comprises a MOSFET having a source-drain path coupled between the output terminal of the first logic decoding means and the input of the second word line driver, and wherein each of the MOSFETs of the first and second reset means has a gate coupled to receive a signal indicating whether the memory array is in a non-selection mode.

5. A semiconductor memory device according to claim 2, wherein said first reset means comprises a MOSFET having a source-drain path connected between the first power supply voltage and the input of the first word line driver and having a gate coupled to the gate of the MOSFET of the first switch, and wherein said second reset means comprises a MOSFET having a source-drain path connected between the first power supply voltage and the input of the second word line driver and having a gate coupled to the gate of the MOSFET of the second switch.

6. A semiconductor memory device comprising:
a memory array having a plurality of word lines, a plurality of data lines formed to intersect with said plurality of word lines and a plurality of memory cells formed at intersections of said word lines and said data lines;
a first word line driver for driving at least a first one of said word lines;
a second word line driver for driving at least a second one of said word lines;
a first logic decoding means coupled to receive a first group of address signals, and including means for providing an output signal at an output terminal in accordance with said first group of address signals;
a first switch for coupling said output terminal of said first logic decoding means to an input of the first word line driver;
a second switch for coupling said output terminal of said first logic decoding means to an input of the second word line driver; and
a second logic decoding means coupled to receive a second group of address signals, and including means for selectively activating a predetermined one of said first switch and said second switch base on said second group of address signals to selectively connect the output terminal of said first logic decoding means to one of the input terminals of said first word line driver and said second word line driver,
further comprising first reset means coupled to the input of the first word line driver to set an input signal level of said first word line driver to a predetermined non-selection level, and a second reset means coupled to the input of the second word line driver to set an input signal level of the second word line driver to a predetermined non-selection level.

7. A semiconductor memory device comprising:
a plurality of word lines;
a plurality of data lines arranged to intersect said word lines;
a plurality of memory cells arranged at predetermined intersections of said word lines and said data lines;
first word line drive means for driving at least a first word line;
second word line drive means for driving at least a second word line;
first selection means for providing an output for selecting said first word line drive means and said second word line drive means;
first switch means disposed between said first word line drive means and said first selections means;
second switch means disposed between said second word line drive means and said first selection means;
second selection means for selectively turning ON one of said first switch means and said second switch means to selectively couple said output of said first selection means to a predetermined one of said first word line drive means and said second word line drive means;
third selection means coupled to said data lines for selecting predetermined data lines; and
input means and output means coupled to said data lines in accordance with the operation of said third selection means to respectively provide data to said data lines and to receive data from said data lines based on the operation of said third selection means.

8. A semiconductor memory device according to claim 7, which further includes input signal level setting means for setting an input signal level of said first word line drive means and an input signal level of said second word line drive means to a non-selection level.

9. A semiconductor memory device according to claim 8, wherein said input signal level setting means is connected between said first switch means and said first word line drive means and between said second switch means and said second word line drive means, and wherein said second selection means includes a function of turning off both said first switch means and said second switch means.

10. A semiconductor memory device according to claim 9, wherein said first switch means is comprised of a MOSFET having input and output terminals, wherein one of the input and output terminals is connected to an output terminal of said first selection means, and the other of said input and output terminals is connected to an input terminal of said first word line drive means, said MOSFET further including a gate which is connected to a first output terminal of said second selection means, and further wherein said second switch means is comprised of a MOSFET having input and output terminals, wherein one of said input and output terminals is connected to said output terminal of said first selection means, and the other of said input and output terminals is connected to an input terminal of said second word line drive means, said MOSFET of said second switch means further including a gate connected to a second output terminal of said second selection means.

11. A semiconductor memory device according to claim 10, wherein said first selection means includes a plurality of MOSFETs which are cascaded between the output terminal of said first selection means and a first power source voltage terminal, wherein gates of said plurality of MOSFETs receive predetermined address signals, respectively.

12. A semiconductor memory device according to claim 11, wherein said first selection means further includes a first precharge MOSFET disposed between said output terminal of said first selection means and a second power source voltage terminal.

13. A semiconductor memory device according to claim 12, wherein said input signal level setting means includes a second precharge MOSFET having input and output terminals, wherein one of said input and output terminals is connected to the input terminal of said first word line drive means.

14. A semiconductor memory device according to claim 13, wherein the other of said input and output terminals of said second precharge MOSFET is connected to said second power source voltage terminal, and wherein control signals which are in synchronism with each other are supplied to gates of said first and second precharge MOSFETs.

15. A semiconductor memory device according to claim 13, wherein the other of said input and output terminals of said second precharge MOSFET is connected to said output terminal of said first selection means, and wherein control signals which are in synchronism with each other are supplied to gates of said first and second precharge MOSFETs.

16. A semiconductor memory device according to claim 13, wherein the other of said input and output terminals of said second precharge MOSFET is connected to said second power source voltage terminal, and wherein signals which are in synchronism with each other are supplied to the gate of the MOSFET constituting said first switch means and to a gate of said second precharge MOSFET.

17. A semiconductor memory device according to claim 3, wherein each of said memory cells has a flip-flop circuit for storing information.

18. A semiconductor memory device according to claim 6, wherein each of said memory cells has a flip-flop circuit for storing information.

19. A semiconductor memory device according to claim 14, wherein each of said memory cells has a flip-flop circuit for storing information.

* * * * *